US008886990B2

(12) United States Patent
Meir et al.

(10) Patent No.: US 8,886,990 B2
(45) Date of Patent: Nov. 11, 2014

(54) BLOCK MANAGEMENT SCHEMES IN HYBRID SLC/MLC MEMORY

(75) Inventors: Avraham Meir, Rishon Le-Zion (IL); Alexander Paley, Kfar-Saba (IL); Asif Sade, Moshav Maslul (IL)

(73) Assignee: Apple Inc., Cupertino, CA (US)

( * ) Notice: Subject to any disclaimer, the term of this patent is extended or adjusted under 35 U.S.C. 154(b) by 98 days.

(21) Appl. No.: 13/355,536

(22) Filed: Jan. 22, 2012

(65) Prior Publication Data

US 2012/0246391 A1    Sep. 27, 2012

Related U.S. Application Data

(60) Provisional application No. 61/436,606, filed on Jan. 27, 2011, provisional application No. 61/497,074, filed on Jun. 15, 2011.

(51) Int. Cl.
| | |
|---|---|
| *G06F 11/00* | (2006.01) |
| *G11C 16/34* | (2006.01) |
| *G06F 12/02* | (2006.01) |
| *G06F 12/06* | (2006.01) |
| *G06F 11/20* | (2006.01) |

(52) U.S. Cl.
CPC .......... *G06F 12/0638* (2013.01); *G11C 16/349* (2013.01); *G06F 12/0246* (2013.01); *G06F 11/20* (2013.01)
USPC ............................. 714/6.12; 714/6.1; 714/6.2

(58) Field of Classification Search
USPC ......................................... 714/6.1, 6.11, 6.12
See application file for complete search history.

(56) References Cited

U.S. PATENT DOCUMENTS

| 8,040,744 | B2 * | 10/2011 | Gorobets et al. .............. 365/200 |
| 2008/0115015 | A1 * | 5/2008 | Ikezawa et al. .................. 714/42 |
| 2009/0187785 | A1 * | 7/2009 | Gonzalez et al. ................. 714/5 |
| 2010/0172179 | A1 | 7/2010 | Gorobets et al. |
| 2010/0174847 | A1 * | 7/2010 | Paley et al. .................... 711/103 |
| 2011/0041005 | A1 * | 2/2011 | Selinger ........................... 714/6 |

FOREIGN PATENT DOCUMENTS

| TW | 200519595 | 6/2005 |
| TW | 200821909 | 5/2008 |

OTHER PUBLICATIONS

Extended Search Report in EP Application No. 12172178.1-1953 / 2565792, Feb. 11, 2013, pp. 1-7.
International Search Report and Written Opinion in application No. PCT/US2012/042416 mailed Jan. 14, 2013.
Preliminary Report on Patentability from PCT/US2012/042416, dated Jan. 3, 2014, Apple Inc., pp. 1-10.
Office Action from Taiwanese Patent Application No. 101121635, mailed May 15, 2014, English and Chinese versions, pp. 1-21.

* cited by examiner

*Primary Examiner* — Sarai Butler
(74) *Attorney, Agent, or Firm* — Meyertons, Hood, Kivlin, Kowert & Goetzel, P.C.

(57) ABSTRACT

A method for data storage includes storing data in a memory including multiple analog memory cells arranged in blocks. A first subset of the blocks is defined for storing first data with a first storage density, and a second subset of the blocks is defined for storing second data with a second storage density, larger than the first storage density. In each of the first and second subsets, one or more blocks are allocated to serve as spare blocks and blocks that become faulty are replaced with the spare blocks. Upon detecting that a number of the spare blocks in the second subset has decreased below a predefined threshold, the data is copied from at least one block in the second subset to the first subset, and the at least one block is added to the spare blocks of the second subset.

30 Claims, 2 Drawing Sheets

BLOCK MANAGEMENT SCHEMES IN HYBRID SLC/MLC MEMORY

CROSS-REFERENCE TO RELATED APPLICATIONS

This application claims the benefit of U.S. Provisional Patent Application 61/436,606, filed Jan. 27, 2011, and U.S. Provisional Patent Application 61/497,074, filed Jun. 15, 2011, whose disclosures are incorporated herein by reference.

FIELD OF THE INVENTION

The present invention relates generally to data storage, and particularly to methods and systems for memory block management in memory devices.

BACKGROUND OF THE INVENTION

Some memory devices, such as Flash devices, comprise multiple memory blocks. Various techniques for memory block management are known in the art. For example, U.S. Pat. No. 8,040,744, whose disclosure is incorporated herein by reference, describes techniques for management of spare blocks in a reprogrammable non-volatile memory system, such as a Flash EEPROM system. In one set of techniques, for a memory partitioned into two sections such as a binary section and a multi-state section, where blocks of one section are more prone to error, spare blocks can be transferred from the more error prone partition to the less error prone partition. In another set of techniques, blocks which fail in the more error prone partition are transferred to serve as spare blocks in the other partition.

As another example, U.S. Patent Application Publication 2010/0174847, whose disclosure is incorporated herein by reference, describes techniques in which a portion of a non-volatile memory is partitioned from a main multi-level memory array to operate as a cache. The cache memory is configured to store at less capacity per memory cell and finer granularity of write units compared to the main memory. The cache memory has a capacity dynamically increased by allocation of blocks from the main memory in response to a demand to increase the capacity. Preferably, a block with an endurance count higher than average is allocated. The logical addresses of data are partitioned into zones to limit the size of the indices for the cache.

SUMMARY OF THE INVENTION

An embodiment of the present invention that is described herein provides a method for data storage. The method includes storing data in a memory including multiple analog memory cells arranged in blocks. A first subset of the blocks is defined for storing first data with a first storage density, and a second subset of the blocks is defined for storing second data with a second storage density, larger than the first storage density. In each of the first and second subsets, one or more blocks are allocated to serve as spare blocks and blocks that become faulty are replaced with the spare blocks. Upon detecting that a number of the spare blocks in the second subset has decreased below a predefined threshold, the data is copied from at least one block in the second subset to the first subset, and the at least one block is added to the spare blocks of the second subset.

In some embodiments, storing the data includes programming the memory cells in the first subset using a first number of programming levels per memory cell, and programming the memory cells in the second subset using a second number of programming levels per memory cell, larger than the first number. In an embodiment, the first storage density includes one bit per memory cell. In a disclosed embodiment, copying the data and adding the at least one block include maintaining the number of the spare blocks in the second subset at no more than a predefined upper bound. In an embodiment, the upper bound includes a single spare block.

In some embodiments, storing the data includes carrying out in the first subset a block compaction process that uses the spare blocks in the first subset as over-provisioning overhead. In an embodiment, the method includes selecting the at least one block in the second subset according to a predefined selection criterion. In an example embodiment, the selection criterion depends on an amount of valid data in the at least one block. In another embodiment, the selection criterion depends on a number of fragments into which valid data in the at least one block is fragmented. In yet another embodiment, the selection criterion depends on a time at which data in the at least one block was most recently invalidated.

There is additionally provided, in accordance with an embodiment of the present invention, a data storage apparatus including an interface and a processor. The interface is configured to communicate with a memory including multiple analog memory cells arranged in blocks, wherein a first subset of the blocks is defined for storing first data with a first storage density, and a second subset of the blocks is defined for storing second data with a second storage density, larger than the first storage density. The processor is configured to allocate in each of the first and second subsets one or more blocks to serve as spare blocks, to replace blocks that become faulty with the spare blocks, and, upon detecting that a number of the spare blocks in the second subset has decreased below a predefined threshold, to copy the data from at least one block in the second subset to the first subset, and to as add the at least one block to the spare blocks of the second subset.

There is also provided, in accordance with an embodiment of the present invention, a method for data storage in a memory that includes multiple blocks. The method includes running a compaction process that selects one or more of the blocks containing both valid data and invalid data, copies the valid data from the selected blocks to other storage locations, and then erases the selected blocks. Within a given area of the memory, a block containing the least-recently programmed valid data among the valid data stored in the given area is identified. The identified block is selected as a candidate for the compaction process. In an embodiment, identification and selection of the block is performed irrespective of an amount of the valid data in the block.

There is further provided, in accordance with an embodiment of the present invention, a data storage apparatus including an interface and a processor. The interface is configured to communicate with a memory that includes multiple blocks. The processor is configured to run a compaction process that selects one or more of the blocks containing both valid data and invalid data, copies the valid data from the selected blocks to other storage locations, and then erases the selected blocks, and is further configured to identify, within a given area of the memory, a block containing the least-recently programmed valid data among the valid data stored in the given area, and to select the identified block as a candidate for the compaction process.

There is moreover provided, in accordance with an embodiment of the present invention, a method for data storage in a memory that includes multiple blocks and is divided into a first area for data caching and a second area for long-term data storage. The method includes running a compaction process that selects in the first area one or more of the blocks containing both valid data and invalid data, copies the valid data from the selected blocks to other storage locations in the memory, and then erases the selected blocks. A block is selected in the first area as a candidate for the compaction process based on a number of write operations in the second area that would be incurred by compaction of the candidate block.

In some embodiments, the data is stored in the second area in accordance with a logical-to-physical address mapping that assigns physical storage locations to respective logical mapping units, each including at least one block, and selecting the block includes choosing the block based on a number of the logical mapping units to which the valid data in the block belong. In an embodiment, selecting the block includes assigning to at least some of the blocks in the first area respective scores that are inversely related to respective numbers of the write operations in the second area that would be incurred by compaction of the blocks, and giving high priority in choosing the block for the compaction process to the blocks having high scores.

There is additionally provided, in accordance with an embodiment of the present invention, a data storage apparatus including an interface and a processor. The interface is configured to communicate with a memory that includes multiple blocks and is divided into a first area for data caching and a second area for long-term data storage. The processor is configured to run a compaction process that selects in the first area one or more of the blocks containing both valid data and invalid data, copies the valid data from the selected blocks to other storage locations in the memory and then erases the selected blocks, and is further configured to select in the first area a block as a candidate for the compaction process based on a number of write operations in the second area that would be incurred by compaction of the candidate block.

The present invention will be more fully understood from the following detailed description of the embodiments thereof, taken together with the drawings in which:

DETAILED DESCRIPTION OF EMBODIMENTS

Overview

In some memory systems, e.g., in some Flash-based Solid State Drives (SSD), a certain memory area is configured to hold data at a smaller storage density relative to the rest of the memory. For example, the lower-density area may be configured to hold a single bit per memory cell (referred to as a Single-Level Cell—SLC—configuration), and the higher-density area may be configured to hold multiple bits per memory cell (referred to as a Multi-Level Cell—MLC—configuration). Although the difference in storage density can be implemented in various ways, the lower-density and higher-density areas are referred to herein generally as SLC and MLC areas, respectively.

In return for the lower storage density, the SLC area is typically characterized by faster programming and readout and by improved endurance, retention and storage reliability in comparison with the MLC area. The SLC area can be used for various purposes, such as for caching incoming data before transferring the data to the MLC area, or for storing sensitive or frequently-updated ("hot") data. Typically, the SLC area is considerably smaller than the MLC area.

Embodiments of the present invention that are described herein provide improved methods and systems for memory management in memories that are partitioned into SLC and MLC areas. Typically, the memory comprises multiple memory blocks, each comprising multiple analog memory cells. In some embodiments, a memory controller allocates one or more memory blocks to serve as spare blocks in each of the SLC and MLC areas. The spare blocks are used, for example, for replacing blocks that become faulty ("bad blocks") or for increasing the over-provisioning overhead of the memory—as explained in detail below.

In some disclosed embodiments, the memory controller allocates only a minimal number of spare blocks in the MLC area, and as many spare blocks as possible in the SLC area. Since the SLC area is significantly smaller than the MLC area, each spare block adds a much larger percentage of spare memory in the SLC area than in the MLC area. Therefore, the performance gain achieved by allocating additional spare blocks in the SLC area is usually much greater than the performance degradation caused by allocating fewer of these spare blocks in the MLC area.

Maintaining a small number of spare blocks in the MLC area may be risky: MLC memory blocks may become faulty during use, and the MLC area may run out of spare blocks to replace them. Thus, in some disclosed embodiments, the memory controller verifies that the number of spare blocks in the MLC area does not fall below a certain minimum threshold. Upon detecting that the number of spare blocks in the MLC area is too low, the memory controller copies the data from one or more blocks in the MLC area to the SLC area, and uses the blocks released in the MLC area as spare blocks.

The above-described technique enables the memory controller to allocate a large number of spare blocks to the SLC area, and thus operate the SLC area at high throughput and endurance because of the high over-provisioning ratio. At the same time, the MLC area is continuously provided with a sufficient number of spare blocks. This trade-off helps to improve the overall performance of the memory system. For example, when the SLC area is used for caching data or for storing management information related to the MLC area, storing this information more efficiently improves the MLC performance, as well.

Other disclosed embodiments have to do with block compaction processes (also referred to as "garbage collection") that are performed by the memory controller in the SLC area. These embodiments provide improved criteria for selecting candidate blocks for compaction. In some embodiments, the memory controller selects as candidates for compaction the oldest blocks, i.e., the blocks containing the least-recently written data. This criterion enables fast and straightforward management, for example because it does not require the memory controller to assess the amount of valid data in each block.

In alternative embodiments, the memory controller selects candidate SLC blocks for compaction by considering the number of write operations in the MLC area that the compaction would incur. SLC blocks whose compaction would incur a small number of write operations in the MLC area are typically preferred. In an example embodiment, the memory controller stores data in the memory using a logical-to-physical address mapping that is defined over mapping units of a certain size, e.g., blocks or groups of blocks. In these embodiments, the memory controller may select candidate blocks for compaction by considering not only the amount of valid data in the block, but also the number of mapping units to which the valid data belongs. It is typically preferable to perform compaction on a block whose data belongs to a small number of mapping units, since the compaction will involve copying a smaller amount of data to the MLC area.

System Description

Figure 1:
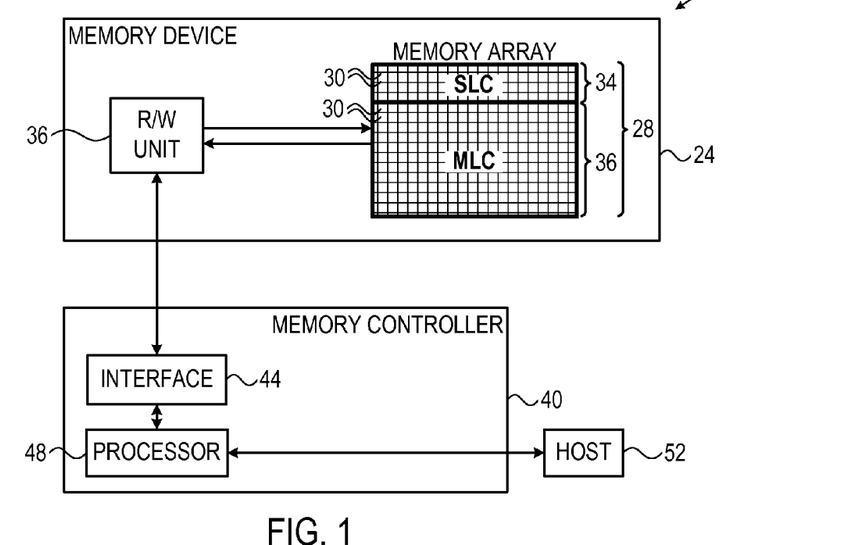
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 30. Each memory block 30 comprises multiple analog memory cells. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into the memory cells. In alternative embodiments, the R/W unit does not perform the conversion, but is provided with voltage samples, i.e., with the storage values for storage in the cells. When reading data out of array 28, R/W unit 36 converts the storage values of the memory cells into digital samples having a resolution of one or more bits. Data is typically written to and read from the memory cells in groups that are referred to as pages. In some embodiments, the R/W unit can erase a group of memory cells by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. In particular, processor 48 carries out memory block management schemes that are described herein.

Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, the memory cells in each block 30 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 30. Typically although not necessarily, a memory block is on the order of $10^6$ memory cells, whereas a page is on the order of $10^3$-$10^4$ memory cells.

Memory Partitioning into SLC and MLC Areas Having Spare Blocks

In some embodiments, memory blocks 30 are partitioned into a Single-Level Cell (SLC) area 34 and a Multi-Level Cell (MLC) area 36. Areas 34 and 36 differ from one another in storage density, i.e., in the number of bits per memory cell used for storing data—The storage density in MLC area 36 is higher than in SLC area 34. In some embodiments, the memory cells in SLC area 34 hold a single bit per memory cell (e.g., by being programmed to two possible programming levels), whereas the memory cells in MLC area 36 hold multiple bits per cell (e.g., by being programmed to more than two possible programming levels). Alternatively, the memory cells in area 34 may have any other suitable storage density that is lower than that of the memory cells in area 36.

Although the embodiments described herein refer to an SLC area storing data at 1 bit/cell and an MLC area storing data at more than 1 bit/cell, the disclosed techniques can be used with any other suitable technique for storing data in one memory area at higher density than in another memory area. Alternatively to using different numbers of programming levels, different storage densities can be implemented in areas 34 and 36 using any other suitable technique.

Because of the smaller storage density, SLC area 34 typically is typically characterized by faster programming, longer endurance and retention and sometimes higher storage reliability. In various embodiments, the SLC area may serve different functions in system 20. For example, SLC area 34 may be used for temporarily caching data received from the host, until the data is copied to its long-term destination address in MLC area 36. This function is sometimes referred to as "binary cache" or "SLC cache." Additionally or alternatively, SLC area 34 may be used for storing highly sensitive information such as mapping tables. As yet another example, SLC area 34 can be used for storing data that is updated frequently ("hot" data).

Typically, the size of SLC area 34 is considerably smaller that the size of MLC area 36. In one example embodiment, the SLC area comprises fifty blocks 34, whereas MLC area 36 comprises two thousand blocks. Alternatively, any other suitable proportions between the sizes of the SLC and MLC areas can be used. In some embodiments, the memory cells and memory blocks in the SLC area are different in structure from those in the MLC area. In other embodiments, the memory cells and memory blocks in the SLC area are similar or identical to those in the MLC area.

In some embodiments, each of the SLC and the MLC areas comprises a certain number of blocks 34 that serve as spare blocks. Spare blocks can be used for various purposes, such as for replacing blocks that become faulty ("bad blocks") and for over-provisioning used in compaction or "garbage collection" processes, as explained below.

In analog memory such as device 24, data is written to the memory in page units, but erasure is applied to entire memory blocks. Data is written only to erased pages, and it is therefore not possible to update data in-place. Updating data involves writing the updated data to another physical storage location, marking the previous version of the data as invalid, and dynamically mapping logical addresses to physical storage locations.

Because of the above characteristics, the memory blocks of the memory gradually accumulate invalid data pages, whose updated versions have been stored in other physical storage locations. In order to reduce the number of invalid pages, the memory controller carries out a compaction, or "garbage collection" process. This process selects one or more memory blocks for compaction, copies the valid data from the selected memory blocks to other storage locations, and then erases the selected memory blocks. The erased blocks are then ready for subsequent programming.

The efficiency of the compaction process (which can be quantified, for example, by the average number of copy operations performed per block compaction) improves as a function of the over-provisioning ratio of the memory (the ratio between the true physical capacity of the memory and the specified capacity that is provided to external entities for storing data).

Typically, the aggregated size of the memory areas that do not hold valid data ("holes") within blocks 30 is referred to as an over-provisioning overhead. The over-provisioning overhead can be specified as an over-provisioning ratio, which is defined as a fraction of the specified memory capacity. For example, when the memory uses an over-provisioning ratio of 5% and the memory is logically full, each memory block is only 95% programmed, on average.

When the memory is over-provisioned, garbage collection can be performed more efficiently. In other words, the number of copy operations per block compaction can be reduced. The efficiency of the garbage collection process increases as a function of the over-provisioning ratio used in the memory. Increasing the over-provisioning ratio reduces the wearing of memory cells, and also increases the programming throughput. The effect of the over-provisioning overhead on cell wearing and storage throughput is particularly strong when the memory is full or nearly full.

Typically, processor 48 allocates one or more blocks 30 to serve as spare blocks in SLC area 34, and one or more blocks 30 to serve as spare blocks in MLC area 36. Each spare block is used within its respective area (SLC or MLC), for example as a candidate for replacing a block that becomes faulty during use, or for increasing the over-provisioning ratio and thus improving the efficiency of the compaction process.

Efficient Allocation of Spare Blocks in SLC and MLC Areas

Memory controller 40 may allocate any desired number of blocks 30 to serve as spare blocks in either SLC area 34 or MLC area 36. Moreover, the memory controller may copy data from one area to another in order to increase the number of spare blocks in one area at the expense of the other.

In some embodiments of the present invention, memory controller 40 allocates a large number of spare blocks in the SLC area, at the expense of maintaining only a minimal number of spare blocks in the MLC area. This sort of allocation improves the performance of the SLC area significantly. As noted above, the SLC area is typically considerably smaller than the MLC area. Therefore, the performance gain achieved by allocating additional spare blocks in the SLC area is usually much greater than the performance degradation caused by removing these spare blocks from the MLC area.

Consider, for example, a memory that is partitioned into a 2 bit/cell MLC area having a specified size of 2,000 blocks and twenty additional spare blocks, and a 1 bit/cell SLC area having fifty blocks. In comparison, consider a scenario in which nineteen of the twenty spare blocks are reallocated to the SLC area, meaning that the MLC area has only a single spare block while the SLC area has sixty-nine spare blocks instead of fifty. This reallocation means an increase of approximately 40% in the number of spare blocks in the SLC area—An increase that provides a considerable performance improvement. The single spare block in the MLC area still enables the memory controller to carry out block compaction, although possibly at reduced efficiency.

In practice, some of the memory blocks in MLC area may become faulty ("bad blocks") over time. When memory controller 40 detects that a memory block is faulty, it replaces this block with a spare block. When the MLC area is allocated only a minimal number of spare memory blocks (e.g., a single spare block as in the example above), the spare blocks in the MLC area may all be used at some point. In such a case, the memory space that is available for storing user data may fall below the specified size.

Thus, in some embodiments, processor 48 in the memory controller copies data from MLC area 36 to SLC area 34 in order to free additional spare blocks in the MLC area, upon detecting that the number of spare blocks in the MLC area drops below a certain minimal value. In some embodiments, processor 48 maintains the number of spare blocks in the MLC area at no more than a certain upper bound. These mechanisms adaptively maintain a sufficient number of spare blocks in the MLC area, while at the same time allocating the highest possible number of spare blocks to the SLC area.

Processor 48 may detect faulty blocks in the MLC area using any suitable technique, for example by detecting blocks that fail to erase or blocks that fail to program data correctly.

Figure 2:
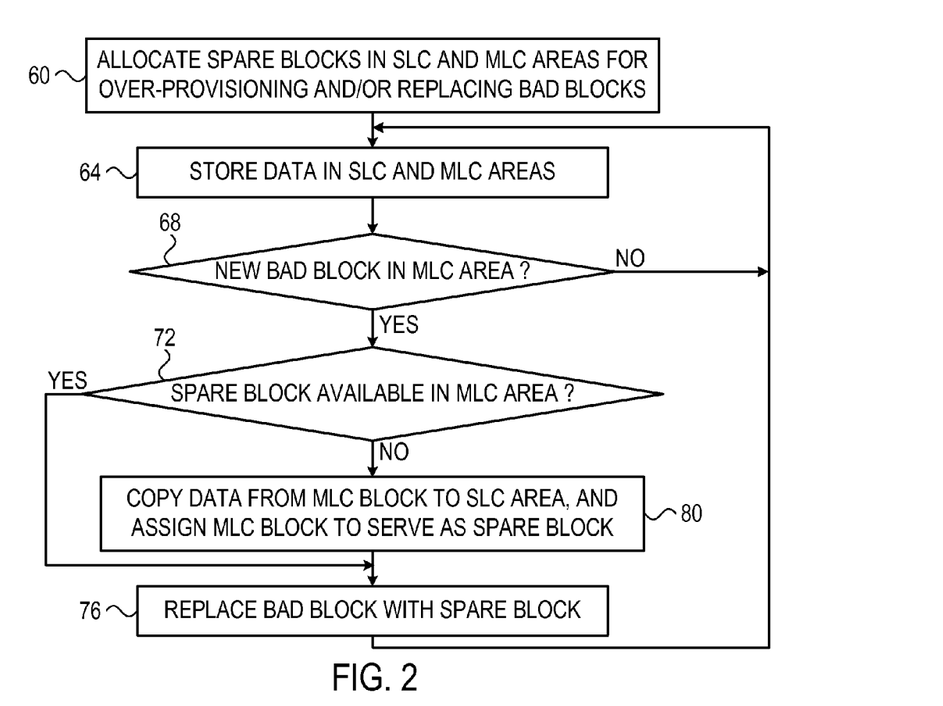
FIGS. 2-4 are flow charts that schematically illustrate methods for managing memory blocks, in accordance with embodiments of the present invention.

FIG. 2 is a flow chart that schematically illustrates a method for managing memory blocks, in accordance with an embodiment of the present invention. The method begins with processor 48 in memory controller 40 allocating spare memory blocks to the SLC and MLC areas, at an initial allocation step 60. Processor 48 allocates one or more blocks to serve as spare blocks in SLC area 34, and one or more blocks to serve as spare blocks in MLC area 36. As explained above, processor 48 typically allocates as many as possible spare blocks in the SLC area, and only a certain minimal number of spare blocks in the MLC area.

Processor 48 stores data in the SLC and MLC areas, at a storage step 64. The specific storage processes may differ from one embodiment to another, for example depending on the functionality of the SLC area (e.g., binary cache, or storage space for sensitive or frequently-updated data). Typically, processor 48 carries out garbage collection and replacement of bad blocks separately within each of the SLC and MLC areas, using the spare blocks allocated to each area.

During operation, processor 48 checks whether a new faulty block exists in MLC area 36, at a bad block checking step 68. If no new bad blocks are detected, the method loops back to step 64 above in which system 20 continues to store data.

If a new faulty block is detected in the MLC area, processor 48 checks whether a spare block is available in the MLC area, at a spare block checking step 72. If a spare block is available in the MLC area, processor 48 replaces the faulty block with a spare block, at a replacement step 76. The method then loops back to step 64 above.

If, on the other hand, there are no more available spare blocks in the MLC area, processor 48 frees one or blocks in MLC area 36 to serve as additional spare blocks, at a spare generation step 80. In an embodiment, processor 48 copies data from one or more blocks in MLC area 36 to SLC area 34, and then erases the MLC blocks and assigns them to serve as spare blocks. The data that previously resided in these MLC blocks is now stored in the SLC area, and can be retrieved from this alternative location when requested. Because of the smaller storage density in the SLC area, the data from a given MLC block is typically copied to two or more SLC blocks. Processor 48 may then replace the faulty block with a newly-assigned spare block at step 76, and the method loops back to step 64 above.

The method of FIG. 2 is an example method, which is chosen purely for the sake of conceptual clarity. In alternative embodiments, other suitable methods can also be used. For example, in the method of FIG. 2, a new spare block is created in the MLC area when the number of available spare blocks in the MLC area drops to zero (i.e., no more spare blocks are available). In alternative embodiments, the process may be initiated when the number of spare blocks in the MLC area drops below any other suitable threshold. The above process may be used to create any suitable number of new spare blocks in the MLC area.

As another example, in the method of FIG. 2 a new spare MLC block is created in response to detecting a bad block in the MLC area. In alternative embodiments, a new spare block may be created in response to other events or periodically, as needed. For example, processor 48 may run a background task that checks whether the number of spare blocks in the MLC area is below the permitted minimum number. If the number of spare blocks in the MLC area is too low, processor 48 may produce one or more new spare MLC blocks by copying data to the SLC area.

Processor 48 may use various methods and criteria to select which MLC block to free and convert to a spare block. In an example embodiment, processor 48 chooses the block having the smallest amount of valid data—A criterion that typically reduced the number of copy operations needed for freeing the block. In another embodiment, processor 48 chooses the block whose valid data is fragmented into the smallest number of fragments—A criterion that typically reduces the size of the virtual-to-physical address mapping of the SLC area. In yet another embodiment, processor 48 chooses the block in which data was most recently invalidated (e.g., as a result of copying the data during compaction in the MLC area). Further alternatively, processor 48 may choose MLC blocks for conversion to spare blocks using any other suitable criteria.

Criteria for Selecting Blocks for Compaction in SLC Area

In some embodiments, processor 48 in memory controller 40 runs a compaction ("garbage collection") process in SLC area 34. The compaction process selects one or more blocks 30 in area 34 that contain both valid and invalid data, copy the valid data to other storage locations (in SLC area 34 and/or in MLC area 36) and then erases the blocks.

Any block compaction operation involves copying a certain amount of data from one location to another. When selecting candidate blocks for compaction, it is typically preferable to select blocks whose compaction will involve copying only a small amount of data. This sort of a selection helps to increase the memory throughput and endurance. Another consideration is the management overhead involved in the candidate selection process.

In some embodiments of the present invention, processor 48 selects as candidates for compaction the (one or more) oldest blocks in the SLC area. In other words, processor 48 selects the one or more blocks that comprise the least-recently programmed data in the SLC area. The term "least-recently programmed data" refers to the time at which the data was written, regardless if this write operation was the result of new data received from the host or the result of an internal copy (e.g., compaction) operation.

Selecting the oldest blocks for compaction enables the memory controller to compact, with high likelihood, blocks that will not be updated in the near future. Moreover, this selection criterion can be implemented in a fast and straightforward manner, since it does not depend on the amount of valid data in the block. In order to use this criterion, the memory controller does not need to assess or track the amount of valid or invalid data per block.

Figure 3:
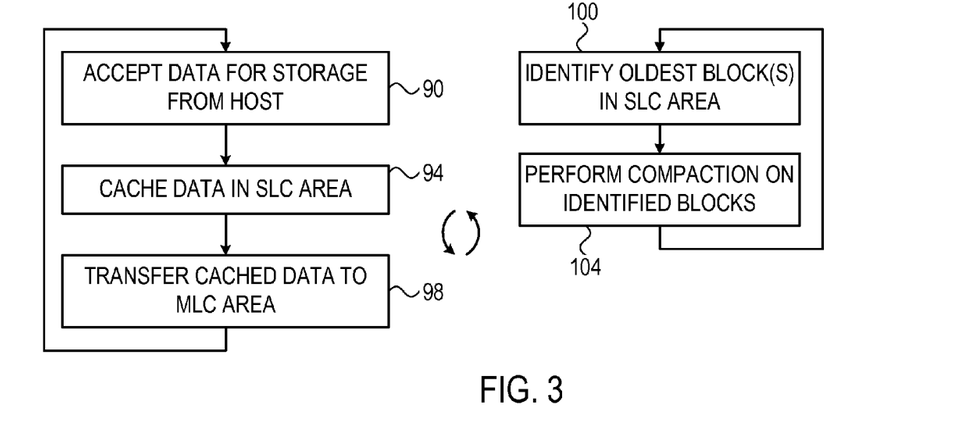

FIG. 3 is a flow chart that schematically illustrates a method for managing memory blocks, in accordance with an embodiment of the present invention. The left-hand-side of the figure shows a storage process, while the right-hand-side of the figure shows a block selection and compaction process. The two processes are typically carried out in parallel by the memory controller.

The storage process begins with processor 48 in memory controller 40 accepting data for storage from host 52, at an input step 90. Processor 48 caches the data in SLC area 34, at a caching step 94. At a later point in time, the memory controller transfers the data from the SLC area for long-term storage in MLC area 36, at a transferring step 98.

The selection and compaction process begins with processor 48 identifying the oldest block or blocks in the SLC area, at an oldest block identification step 100. The oldest block is defined as the block containing the least-recently written data in the SLC area. Processor 48 then compacts the identified block or blocks, at a compaction step 104. Compaction may comprise copying the valid data from the identified oldest block or blocks to a new location, either in the SLC area or in the MLC area. The oldest blocks are then erased and are ready for new programming.

In alternative embodiments, memory controller 40 stores the data in memory device 24 using a logical-to-physical address mapping scheme. In these embodiments, the data is addressed by host 52 using logical addresses, and the memory controller translates the logical addresses into physical storage locations in device 24. When moving data from one physical storage location to another (e.g., during compaction), the memory controller updates the physical storage location mapped to the logical addresses of the moved data.

The logical-to-physical address mapping scheme of the memory controller is typically defined over mapping units of a certain size. In other words, the mapping unit is the basic granularity at which the mapping is defined and performed. The mapping unit size may comprise, for example, a single block or more than one block.

In an example embodiment, the SLC area is used for data caching, the MLC area is used for long-term data storage, and processor 48 carries out a block-based Flash Translation Layer (FTL) that performs compaction in the SLC area according to the following policy:

Select an SLC block for compaction.
Copy at least some of the data from the selected SLC block to the target logical addresses of this data in the MLC area. This operation may involve copying additional data from other blocks in the SLC area to the MLC area, since the data in the selected MLC block may belong to mapping units (logical MLC blocks in this example) that should be copied to the MLC area en-bloc.
Copy remaining data in the selected block to an alternative location (e.g., open block) in the SLC area.

In some embodiments, processor 48 in memory controller 40 selects candidate blocks in SLC area 34 for compaction by considering the number of write operations in the MLC area that the compaction would incur. Such write operations would occur, for example, when copying data from the selected block to the MLC area, as well as when copying to the MLC area data from other SLC blocks that belong to the same mapping units as the data copied from the selected SLC block. Processor 48 typically selects SLC blocks whose compaction would cause a small number (e.g., the smallest possible number) of write operations in the MLC area. Since MLC write operations are dominant in terms of latency, this sort of selection criterion increases the efficiency of the SLC compaction process.

In some embodiments, processor 48 assigns each block in the SLC area a respective score, which is inversely-related to the number of MLC write operations that compaction of the SLC block would incur. In these embodiments, processor 48 gives preference in choosing SLC blocks for compaction to blocks having high scores.

Processor 48 may use any suitable method to estimate the number of write operations in the MLC area that would be caused by compacting a given SLC block. In some embodiments, the estimate would consider the number of mapping units to which the data in the SLC block belongs. Thus, in some embodiments processor 48 selects candidate blocks in SLC area 34 for compaction by considering not only the amount of valid data in the block, but also the number of mapping units to which the valid data belongs. Consider, for example, two block that comprise the same amount of valid data. In one block, however, all the valid data belongs to a single mapping unit, whereas in the other block the valid data belongs to multiple mapping units.

When performing compaction, the valid data is copied from the compacted block to another storage location, at mapping unit granularity. Therefore, if the valid data belongs to a large number of mapping units, a large amount of data will have to be copied. For this reason, it is typically preferable to compact blocks whose valid data belongs to a small number of mapping units.

In some embodiments, processor 48 selects candidate blocks in SLC area 34 for compaction using a criterion that takes into account the number of mapping units to which the valid data in the block belongs. Blocks whose valid data belongs to a small number of mapping units will typically be preferred for compaction, and vice versa. Blocks having small amounts of valid data will typically be preferred for compaction, and vice versa. In some embodiments, processor 48 assigns each block in the SLC area a respective score, which is inversely-related to the amount of valid data in the block and also inversely-related to the number of mapping units to which the valid data in the block belongs. In these embodiments, processor 48 gives preference in choosing blocks for compaction to blocks having high scores.

Figure 4:
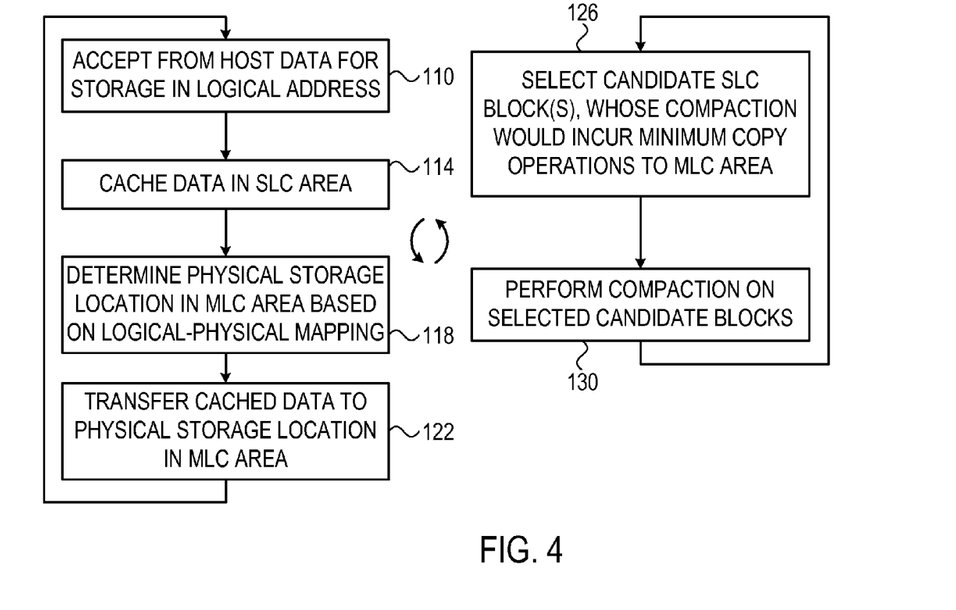

FIG. 4 is a flow chart that schematically illustrates a method for managing memory blocks, in accordance with an embodiment of the present invention. The left-hand-side of the figure shows a storage process, while the right-hand-side of the figure shows a block selection and compaction process. The two processes are typically carried out in parallel by memory controller 40.

The storage process begins with processor 48 in memory controller 40 accepting data for storage from host 52, at a data input step 110. The data is addressed by the host for storage in a certain logical address. Processor 48 caches the data in SLC area 34, at a data caching step 114. Processor 48 determines the physical storage location for the data in MLC area 36, according to the logical-to-physical address mapping, at an address translation step 118. Processor 48 then transfers the data from the SLC area to the appropriate physical storage location in the MLC area, at a data transferring step 122.

The selection and compaction process begins with processor 48 selecting one or more candidate blocks for compaction, at a selection step 126. Processor 48 selects each candidate block based on the number of MLC write operations (e.g., copy from SLC to MLC) that compaction of the candidate block would incur. Typically, preference is given to SLC blocks whose compaction incurs a small amount of write operations in the MLC area. In some embodiments processor 48 computes for each block a metric that quantifies its attractiveness for compaction. Processor 48 then compacts the selected candidate block or blocks, at a block compaction step 130.

Although the embodiments described herein mainly address memory systems comprising SLC and MLC memories, the methods and systems described herein can also be used in other applications, such as in other types of memory systems that comprise memories having different hierarchies or storage densities.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
storing data in a memory comprising multiple memory cells arranged in blocks, wherein a first subset of the blocks is defined for storing first data with a first storage density, and a second subset of the blocks is defined for storing second data with a second storage density, larger than the first storage density;
allocating one or more blocks in each of the first and second subsets of the blocks to serve as spare blocks, wherein a total number of the spare blocks in the first subset of the blocks is greater than a total number of the spare blocks in the second subset of the blocks;
replacing blocks that become faulty with the spare blocks;
upon detecting that the total number of the spare blocks in the second subset has decreased below a predefined threshold, copying data from at least one block in the second subset to at least one block in the first subset; and
adding the at least one block in the second subset to the spare blocks in the second subset.

2. The method according to claim 1, wherein storing the data comprises programming the memory cells in the first subset using a first number of programming levels per memory cell, and programming the memory cells in the second subset using a second number of programming levels per memory cell, larger than the first number.

3. The method according to claim 1, wherein the first storage density comprises one bit per memory cell.

4. The method according to claim 1, wherein copying the data and adding the at least one block in the second subset comprise maintaining the total number of the spare blocks in the second subset at no more than a predefined upper bound.

5. The method according to claim 4, wherein the upper bound comprises a single spare block.

6. The method according to claim 1, wherein storing the data comprises carrying out in the first subset a block compaction process that uses the spare blocks in the first subset as over-provisioning overhead.

7. The method according to claim 1, further comprising selecting the at least one block in the second subset according to a predefined selection criterion.

8. The method according to claim 7, wherein the selection criterion depends on an amount of valid data in the at least one block in the second subset.

9. The method according to claim 7, wherein the selection criterion depends on a number of fragments into which valid data in the at least one block in the second subset is fragmented.

10. The method according to claim 7, wherein the selection criterion depends on a time at which data in the at least one block in the second subset was most recently invalidated.

11. A data storage apparatus, comprising:
an interface configured to communicate with a memory including multiple memory cells arranged in blocks, wherein a first subset of the blocks is defined for storing first data with a first storage density, and a second subset of the blocks is defined for storing second data with a second storage density, larger than the first storage density; and
a processor configured to:
allocate in each of the first and second subsets one or more of the blocks to serve as spare blocks, wherein a total number of the spare blocks in the first subset is greater than a total number of the spare blocks in the second subset;
replace blocks that become faulty with the spare blocks;
copy data from at least one block in the second subset to at least one block the first subset upon detecting that the total number of the spare blocks in the second subset has decreased below a predefined threshold; and
add the at least one block in the second subset to the spare blocks in the second subset.

12. The apparatus according to claim 11, wherein the processor is further configured to program the memory cells in the first subset using a first number of programming levels per memory cell, and to program the memory cells in the second subset using a second number of programming levels per memory cell, larger than the first number.

13. The apparatus according to claim 11, wherein the first storage density comprises one bit per memory cell.

14. The apparatus according to claim 11, wherein the processor is further configured to maintain the total number of the spare blocks in the second subset at no more than a predefined upper bound.

15. The apparatus according to claim 14, wherein the upper bound comprises a single spare block.

16. The apparatus according to claim 11, wherein the processor is further configured to carry out in the first subset a block compaction process that uses the spare blocks in the first subset as over-provisioning overhead.

17. The apparatus according to claim 11, wherein the processor is further configured to select the at least one block in the second subset according to a predefined selection criterion.

18. The apparatus according to claim 17, wherein the selection criterion depends on an amount of valid data in the at least one block in the second subset.

19. The apparatus according to claim 17, wherein the selection criterion depends on a number of fragments into which valid data in the at least one block in the second subset is fragmented.

20. The apparatus according to claim 17, wherein the selection criterion depends on a time at which data in the at least one block in the second subset was most recently invalidated.

21. A method for data storage, comprising:
running a compaction process that includes:
selecting one or more blocks in a memory containing both valid data and invalid data, wherein the memory includes multiple blocks and wherein the invalid data includes data for which newer values have been programmed in other memory locations;
copying the valid data from the one or more selected blocks to other storage locations; and
erasing the one or more selected blocks;
within a given area of the memory, identifying a block containing a least-recently programmed valid data among the valid data stored in the given area; and
selecting the identified block as a candidate for the compaction process.

22. The method according to claim 21, wherein selection of the identified block is performed irrespective of an amount of valid data in the identified block.

23. A data storage apparatus, comprising:
an interface configured to communicate with a memory that includes multiple blocks; and
a processor configured to:
run a compaction process, wherein to run the compaction process, the processor is further configured to:
select one or more of blocks of the multiple blocks containing both valid data and invalid data, wherein the invalid data includes data for which newer values have been programmed in other memory locations;
copy the valid data from the one or more selected blocks to other storage locations; and erase the one or more selected blocks;
identify, within a given area of the memory, a block containing a least-recently programmed valid data among the valid data stored in the given area; and
select the identified block as a candidate for the compaction process.

24. The apparatus according to claim 23, wherein to select the identified block as the candidate for the compaction process, the processor is further configured to select the identified block irrespective of an amount of valid data in the identified block.

25. A method for data storage, comprising:
running a compaction process that includes:
selecting, in a first area of a memory, one or more blocks containing both valid data and invalid data, wherein the memory includes multiple blocks divided into the first area and a second area, and wherein the invalid data includes data for which newer values have been programmed in other memory locations;
copying the valid data from the one or more selected blocks to other storage locations in the memory; and
erasing the one or more selected blocks; and
selecting, in the first area, a block as a candidate for the compaction process dependent upon a number of write operations in the second area that would be incurred by compaction of the candidate block.

26. The method according to claim 25, wherein data is stored in the second area in accordance with a logical-to-physical address mapping that assigns physical storage locations to respective logical mapping units, each comprising at least one block, and wherein selecting the candidate block further comprises choosing the candidate block based on a number of the logical mapping units to which valid data in the candidate block belong.

27. The method according to claim 25, wherein selecting the candidate block comprises assigning to at least some of the blocks in the first area respective scores that are inversely related to respective numbers of the write operations in the second area that would be incurred by compaction of a given block of the blocks in the first area, and giving high priority in choosing the candidate block for the compaction process to blocks having high scores.

28. A data storage apparatus, comprising:
an interface configured to communicate with a memory that includes multiple blocks divided into a first area and a second area; and
a processor configured to:
run a compaction process, wherein to run the compaction process, the processor is further configured to:
select, in the first area, one or more blocks containing both valid data and invalid data, wherein the invalid data includes data for which newer values have been programmed in other memory locations;
copy the valid data from the one or more selected blocks to other storage locations in the memory; and
erase the one or more selected blocks; and
select, in the first area, a block as a candidate for the compaction process dependent upon a number of write operations in the second area that would be incurred by compaction of the candidate block.

29. The apparatus according to claim 28, wherein the processor is further configured to:
store data in the second area in accordance with a logical-to-physical address mapping that assigns physical storage locations to respective logical mapping units, each comprising at least one block; and
select the candidate block based on a number of the logical mapping units to which valid data in the candidate block belong.

30. The apparatus according to claim 28, wherein the processor is further configured to assign, to the blocks in the first area, respective scores that are inversely related to respective numbers of the write operations in the second area that would be incurred by compaction of a given block of the blocks in the first area, and to give high priority in choosing the candidate block for the compaction process to blocks having high scores.

* * * * *